United States Patent
Wang et al.

(10) Patent No.: US 6,861,926 B1
(45) Date of Patent: Mar. 1, 2005

(54) π-TYPE BAND PASS FILTER

(75) Inventors: Tai-Chang Wang, Taipei (TW); Wei-Shin Tung, Tai-Chung Hsien (TW)

(73) Assignee: Formosa Teletek Corporation, Taipei (TW)

( * ) Notice: Subject to any disclaimer, the term of this patent is extended or adjusted under 35 U.S.C. 154(b) by 0 days.

(21) Appl. No.: 10/695,340

(22) Filed: Oct. 27, 2003

(30) Foreign Application Priority Data

Aug. 28, 2003 (TW) ...................................... 92215574 U

(51) Int. Cl.[7] .................................................. H03H 7/00
(52) U.S. Cl. ..................................... 333/175; 333/167
(58) Field of Search ................................ 333/167, 171, 333/170, 175–178, 180, 185

(56) References Cited

U.S. PATENT DOCUMENTS

| | | | | |
|---|---|---|---|---|
| 2,716,734 A | * | 8/1955 | Harris | 333/177 |
| 3,229,229 A | * | 1/1966 | Tozzi | 333/175 |
| 4,063,201 A | | 12/1977 | Komatsubara et al. | 333/168 |
| 6,114,925 A | | 9/2000 | Lo | 333/185 |

* cited by examiner

Primary Examiner—Seungsook Ham

(57) ABSTRACT

An improved band pass filter of π-type inductor is disclosed, which utilizes the serial inductor in the π as a compensating inductor, which can lower the coupling coefficient of the band pass by adjusting the inductance ratio of the compensating inductor to that of the two parallel grounded inductors. Therefore, the coupling coefficient is lowered by adjusting the inductance of the π-type inductors, avoid noise generation, and obtain optimal band pass characteristics, while miniaturizing the filter.

5 Claims, 4 Drawing Sheets

π-TYPE BAND PASS FILTER

FIELD OF THE INVENTION

The present invention relates to a band pass filter and, more particularly, to an apparatus of π-type band pass filer, utilizing a π-type inductor.

BACKGROUND OF THE INVENTION

The coupling coefficient Km represents the selectivity of signals in the frequency domain. The lower the coupling coefficient of a circuit, the higher the circuit's selectivity of signals.

In the design of a band pass filter using an inductor coupling resonant circuit, the coupling is usually realized with neighboring and parallel inductors. Therefore, it is necessary to have a larger space in order to obtain a smaller coupling coefficient. However, as the filter is miniaturized, the dielectric coupling in the circuits is likely to introduce additional noises. It is difficult to design a high-selectivity (narrow band) band pass filter. Furthermore, the coupling coefficients of the conventional filters are solely determined by the coupling inductance of parallel inductors. When designing miniaturized filters, the coupling inductance of parallel inductors will increase as a result of circuits getting to close.

FIG. 1 of the attached drawings shows the structure of a conventional symmetric band pass filter. The left part of the filter is a resonator, comprising a resonant capacitor 11 and a resonant inductor 12. The right part of the filter is also a resonator, comprising a resonant capacitor 14 and a resonant inductor 13. Resonant inductors 12, 13 form the coupling, having a coupling inductance Lm 16. Input signals enter the filter from the signal input end 10, and the signal output end 15 is for signal output. Resonant capacitors 11, 14 have the same capacitance, and resonant inductors 12, 13 have the same inductance.

However, as the coupling between the two resonant inductors 12, 13 is through the dielectric, the distance between the two inductors must be large enough in order to obtain a small enough coupling coefficient. On the other hand, as the distance between the two resonant inductors increases, the dielectric may incorporate more noises, which may greatly affect the characteristics of the filter.

FIG. 2 shows an equivalent circuit of a conventional symmetric band pass filter. The input signals enter from the signal input end 10, and the signal output end 15 is for signal output. The two inductors 22, 24 of the filter are in serial, and a parallel inductor 23 is added at the serial junction and connected to ground 17. A resonant capacitor 21 is place between signal input end 10 and ground 17, while another resonant capacitor 25 is placed between signal output end 15 and ground 17. Resonant capacitors 21, 25 have the same capacitance, and resonant inductors 22, 24 have the same inductance.

In the circuit of FIG. 2, the coupling coefficient Km of the filter is the value of the inductance of parallel inductor 23 divided by the sum of the inductance of serial inductor 22 and the inductance of parallel inductor 23. Therefore, to obtain a smaller coupling coefficient, it is necessary either serial inductor 22 having a very large inductance, or parallel inductor 23 having a very small inductance. However, in practice, serial inductors 22, 24 having large inductance are prone to generate more parasitic serial resistance, which decrease the signal level of the selected frequency. On the other hand, parallel inductor 23 having small inductance faces the following problem: as the inductance from the serial junction point of the two serial inductors 22, 24 to ground 17 is determined by parallel inductor 23 and the parasitic inductor from parallel inductor 23 to ground 17, it is necessary to minimize the inductance of parallel inductor 23 to obtain a smaller coupling coefficient when the parasitic inductance is relatively large. Due to the miniaturization, the components that should be independent are even more closely coupled. Therefore, it is practically difficult to minimize the parallel inductance under this structure.

It is obvious that the conventional inductor coupling resonant band pass filter is not suitable for miniaturization. Therefore, the present invention provides a π-type band pass filter to meet the miniaturization requirement.

SUMMARY OF THE INVENTION

An object of the present invention is to provide an improved R-type band pass filter to meet the miniaturization requirement.

To achieve the aforementioned object, the present invention provides an improved R-type band pass filter, comprising a first resonant capacitor, a first serial inductor, a first parallel inductor, a compensating inductor, a second parallel inductor, a second serial inductor, and a second resonant capacitor. The five inductors form a π-type inductor. The filter has a coupling coefficient of $$\frac{Lm' - (Lm' \,//\, Lm1)}{2 + Lm' - (Lm' \,//\, Lm1')}$$

where Lm' is the inductance of the first parallel inductor divided by the inductance of the first serial inductor, Lm1' is the inductance of the compensating inductor divided by the inductance of the first serial inductor, then divided by 2, and Lm'//Lm1' are the inductance of the parallel inductance of Lm' and Lm1'.

The improved π-type band pass filter disclosed by the present invention uses a π-type inductor to make the coupling coefficient of the filter related to the first serial inductor, the first parallel inductor, and the compensating inductor. By carefully designing the ratio of the π-type inductor, it is possible to lower the coupling coefficient, and improve the selectivity of the filter. The selectivity of the filter is no longer affected solely by the parallel inductors.

These and other objects, features and advantages of the invention will be apparent to those skilled in the art, from a reading of the following brief description of the drawings, the detailed description of the preferred embodiment, and the appended claims.

DETAILED DESCRIPTION OF THE INVENTION

Figure 1:
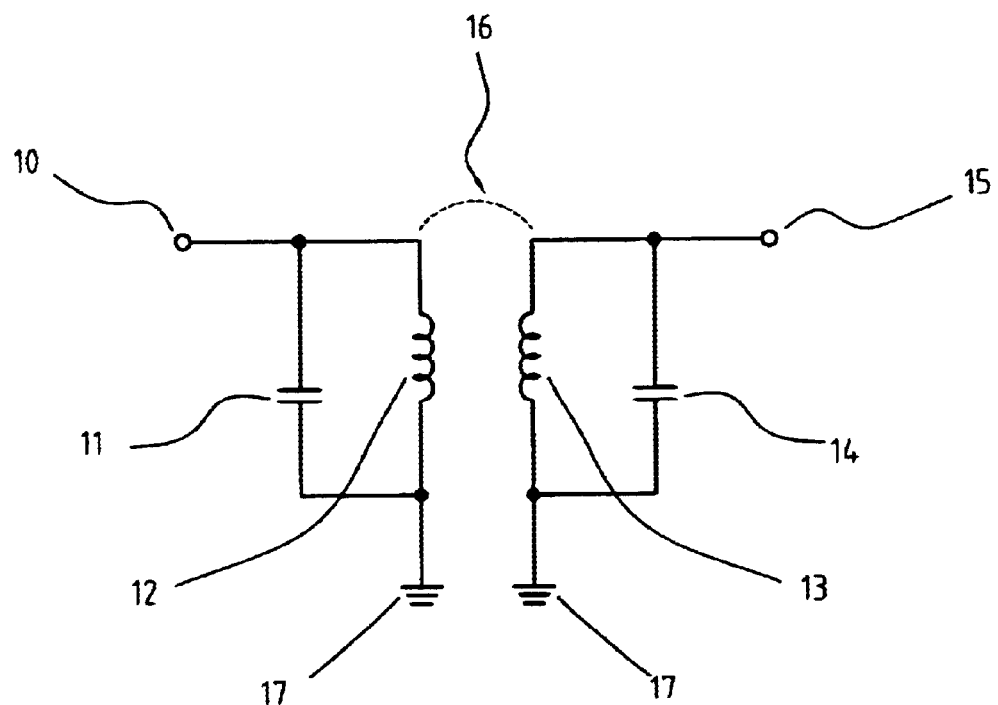
FIG. 1 shows a structure of a conventional π-type band pass filter.
Figure 2:
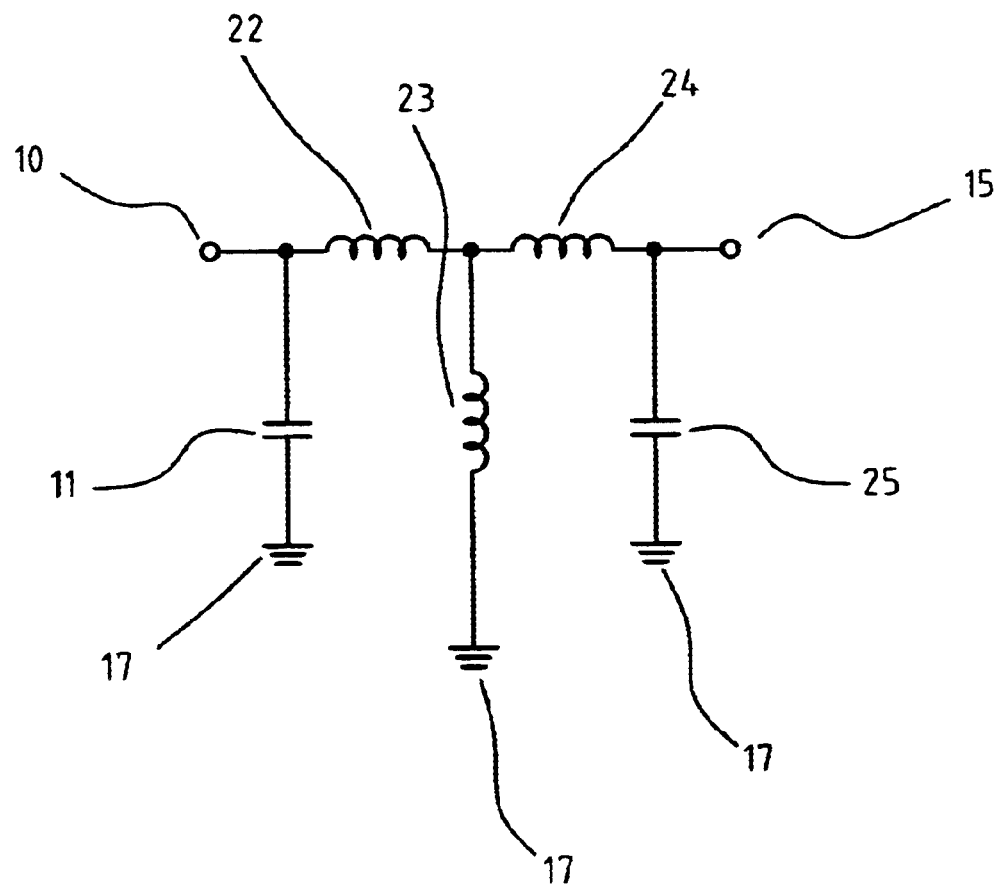
FIG. 2 shows a structure of an improved conventional R-type band pass filter.
Figure 3:
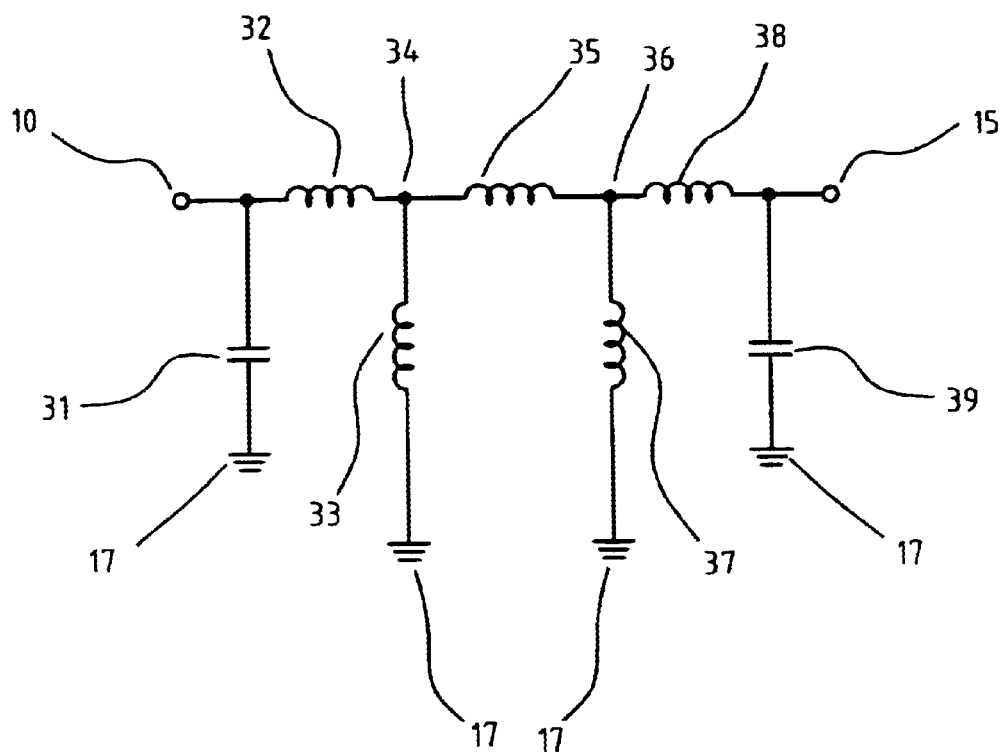
FIG. 3 shows a structure of an improved π-type band pass filter of the present invention.

FIG. 3 shows a π-type band pass filter of the present invention. Input signals enter the filter from the input signal end 10. A first resonant capacitor 31 is placed between input signal end 10 and ground 17, and a first serial inductor 32 is placed between input signal end 10 and a first junction 34. A first parallel inductor 33 is placed between first junction 34 and ground 17. A compensating inductor 35 is placed between first junction 34 and a second junction 36. A second parallel inductor 37 is placed between second junction 36 and ground 17. A second serial inductor 38 is placed between second junction 36 and a signal output end 10. A second resonant capacitor 39 is placed between signal output end 15 and ground 17. The signal output end 15 outputs signals. First and second resonant capacitors 31, 39 have the same capacitance, first and second serial inductors 32, 38 have the same inductance, and first and second parallel inductors 33, 37 have the same inductance.

When signals enter the filter from signal input end 10, the resonator, which comprises first resonant capacitor 31, first serial inductor 32, first parallel inductor 33, and compensating inductor 35, will lock the selected frequency. By adjusting the ration between the two parallel inductors 33, 37 and compensating inductor 35, the selected signals are passed to resonator on the right, comprising second resonant capacitor 39, second serial inductor 38, second parallel inductor 37, and compensating inductor 35. Finally, the filtered signals are outputted from the signal output end 15.

The filter has a coupling coefficient of $$\frac{Lm' - (Lm' // Lm1)}{2 + Lm' - (Lm' // Lm1')}$$

where the normalized compensating inductor Lm' has the inductance of first parallel inductor 33 divided by the inductance of first serial inductor 32, the normalized serial inductor Lm1' has the inductance of compensating inductor 35 divided by the inductance of first serial inductor 32, then divided by 2, and Lm'//Lm1' has the equivalent inductance of the parallel inductance of Lm' and Lm1'. When compensating inductor 35 does not exist, the only tunable parameters of the coupling coefficient Km are parallel inductors 33, 37. When compensating inductor 35 exists, a smaller coupling coefficient Km can be obtained by carefully designing the inductance of compensating inductor 35, and parallel inductors 33, 37, so that the selectivity of the filter improves. Therefore, the π-type band pass filter of the present invention can obtain a smaller coupling coefficient with the same grounded inductors.

Figure 4:
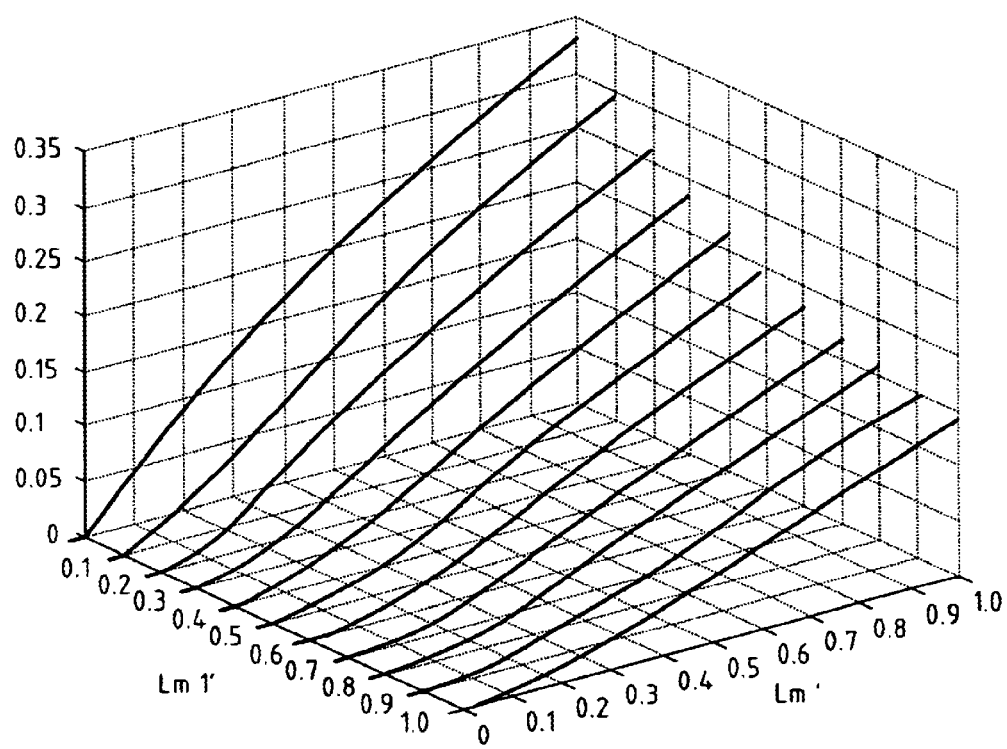
FIG. 4 shows the relationship among the normalized coupling inductance Lm', normalized compensating inductance Lm' and the coupling coefficient Km for a π-type band pass filter of the present invention.

FIG. 4 shows the relationship among the inductance of the normalized coupling inductor Lm', the inductance of the normalized compensating inductor Lm1', and coupling coefficient Km. With the same coupling coefficient Km, the inductance of the normalized coupling inductor Lm' increases as the inductance of the normalized compensating inductor Lm1' increases. Therefore, when choosing the inductance of the normalized coupling inductor Lm' carefully, it is easy to manufacture filters with target characteristics. In addition, the coupling coefficient. Km is determined by the ratio of the inductors shown in FIG. 3.

The present invention uses only a compensating inductor 35 to lower the coupling coefficient Km. Even when the filter has parallel inductors 33, 37 with large inductance, by tuning the ratio between compensating inductor 35 and parallel inductors 33, 37, it is possible to lower the coupling coefficient of the filter.

Based on the aforementioned description, the coupling coefficient of the π-type band pass filter of the present invention is no longer determined solely by the ratio of the inductances of the parallel inductors. In stead, it is determined by the ratio of the inductances of the compensating inductor and the parallel inductors. Therefore, with the same grounded inductors in the design of a π-type band pass filter, the present invention can obtain a smaller coupling coefficient in the miniaturization process.

In addition, by allowing tuning serial inductor to obtain a smaller coupling coefficient, the present invention also provides circuit designers with more flexibility.

While the invention has been described in connection with what is presently considered to the most practical and preferred embodiment, it is to be understood that the invention is not to be limited to the disclosed embodiment, but, on the contrary, it should be clear to those skilled in the art that the description of the embodiment is intended to cover various modifications and equivalent arrangement included within the spirit and scope of the appended claims.

What is claimed is:

1. A band pass filter with a signal input end and a signal output end, comprising:

a first resonant capacitor, connected between the signal input end and a ground, a first serial inductor, connected between the signal input end and a first junction point, a first parallel inductor, connected between the first junction point, and the ground, a compensating inductor, connected between the first junction point and a second junction point, a second parallel inductor, connected between the second junction point and the ground, a second serial inductor, connected between the second junction point and the signal output end, and a second resonant capacitor, connected between the signal output end and the ground, wherein the filter has a coupling coefficient determined by the inductances of the compensating inductor, the first parallel inductor, and the second parallel inductor.

2. The band pass filter as claimed in claim 1, wherein the first resonant capacitor and the second resonant capacitor have the same capacitance.

3. The band pass filter as claimed in claim 1, wherein the first serial inductor and the second serial inductor have the same inductance.

4. The band pass filter as claimed in claim 1, wherein the first parallel inductor and the second parallel inductor have the same inductance.

5. The band pass filter as claimed in claim 1, wherein the coupling coefficient is determined by tuning inductances of the compensating inductor and the first parallel inductor, and have the value of $$\frac{Lm' - (Lm' // Lm1)}{2 + Lm' - (Lm' // Lm1')}$$

wherein Lm' is the inductance of the first parallel inductor divided by the inductance of the first serial inductor, Lm1' is the inductance of the compensating inductor divided by the inductance of the first serial inductor, then divided by 2, and Lm'//Lm1' is the equivalent inductance of the parallel inductance of Lm' and Lm1'.

* * * * *